United States Patent [19]

Kitaura et al.

[11] Patent Number: 5,260,037
[45] Date of Patent: Nov. 9, 1993

[54] APPARATUS FOR PRODUCING SILICON SINGLE CRYSTAL

[75] Inventors: Kiichiro Kitaura; Makoto Ito; Kaoru Kuramochi, all of Amagasaki, Japan

[73] Assignees: Osaka Titanium Co., Ltd., Amagasaki; Kyushu Electronic Metal Co., Ltd., Saga, both of Japan

[21] Appl. No.: 903,950

[22] Filed: Jun. 26, 1992

Related U.S. Application Data

[62] Division of Ser. No. 554,552, Jul. 19, 1990, Pat. No. 5,152,867.

[30] Foreign Application Priority Data

Mar. 12, 1990 [JP] Japan ................................ 2-60586

[51] Int. Cl.$^5$ ............................................. B01D 9/00
[52] U.S. Cl. ............................ 422/249; 156/617.1; 156/620.4; 156/DIG. 64
[58] Field of Search ............. 156/617.1, 618.1, 620.4, 156/DIG. 64; 422/249

[56] References Cited

U.S. PATENT DOCUMENTS

| | | | |
|---|---|---|---|
| 4,133,969 | 1/1979 | Zumbrunnen | 156/617.1 |
| 4,235,848 | 11/1980 | Sokolov et al. | 422/249 |
| 4,330,362 | 5/1982 | Zulehner | 422/249 |
| 4,350,557 | 9/1982 | Scholl et al. | 156/601 |
| 4,565,671 | 1/1986 | Matsutani et al. | 156/617.1 |
| 4,609,425 | 9/1986 | Mateika et al. | 156/617 |
| 5,132,091 | 7/1992 | Azad | 156/601 |
| 5,137,699 | 8/1992 | Azad | 156/601 |
| 5,152,867 | 10/1992 | Kitaura et al. | 156/617.1 |
| 5,162,072 | 11/1992 | Azad | 156/601 |

FOREIGN PATENT DOCUMENTS

| | | |
|---|---|---|
| 0294758 | 12/1988 | European Pat. Off. |
| 263310 | 12/1988 | Fed. Rep. of Germany |
| 58-32100 | 2/1983 | Japan |
| 58-140392 | 8/1983 | Japan |
| 61-227986 | 10/1986 | Japan |
| 63-215587 | 9/1988 | Japan |
| 64-42388 | 2/1989 | Japan |
| 1-294588 | 11/1989 | Japan |
| 2084046 | 4/1982 | United Kingdom |

OTHER PUBLICATIONS

T. Suzuki et al., "CZ Silicon Crystals Grown in a Transverse Magnetic Field," pp. 90-100.

Keigo Hoshikawa et al., "Low Oxygen Content Czochralski Silicon Crystal Growth," *Japanese Journal of Applied Physics*, vol. 19, No. 1, pp. L33-36. (Jan. 1980).

*Primary Examiner*—Olik Chaudhuri
*Assistant Examiner*—Felisa Garrett
*Attorney, Agent, or Firm*—Burns, Doane, Swecker & Mathis

[57] ABSTRACT

An apparatus and a method for producing a silicon single crystal by Czochralski method, whereby the silicon single crystal is pulled up from a crucible while the crucible is heated by a side heater in the lateral periphery of the crucible and a bottom heater facing the bottom of the crucible. The outputs of the side heater and bottom heater are controlled independently each other so that an oxygen concentration in the pull-up direction of the pulled-up silicon single crystal is rendered uniform. In addition to the output control of the heaters, a magnetic field is applied to a molten liquid in the crucible, so that, a dopant concentration in a radial direction of the pulled-up silicon single crystal is rendered uniform.

8 Claims, 11 Drawing Sheets

APPARATUS FOR PRODUCING SILICON SINGLE CRYSTAL

This application is a division of application Ser. No. 07/554,552, filed Jul. 19, 1990, now U.S. Pat. No. 5,152,867.

BACKGROUND OF THE INVENTION

1. Field of the Invention

This invention relates to an apparatus and a method for producing a silicon single crystal by the Czochralski method, and more particularly to an apparatus and a method for producing a silicon single crystal, which achieves uniformity of an oxygen concentration in a pull-up direction of the resultant silicon single crystal.

2. Description of Related Art

It is a general practice in producing a silicon single crystal by the Czochralski method that raw materials put in a crucible, for example, inside a chamber are heated and melted by a heater, and then a seed crystal is dipped in this molten liquid and pulled upwards while it is being rotated, whereby a silicon single crystal grows at the lower end of the seed crystal.

Meanwhile, the following two points are vital to manufacture a semiconductor integrated circuit employing a substrate of silicon single crystal. That is, an adequate amount of oxygen should be contained in the substrate of silicon single crystal so as to gain a so-called Intrinsic Gettering (IG) effect. "Gettering" means a process that removes harmful impurities, e.g. heavy metals, from the regions in a wafer where devices are fabricated. "Wafer" means disk-shaped substrate. IG uses the defects associated with oxygen precipitation in the interior of the wafer, for trapping sites for the harmful impurities. (S. M. Sze, "VLSI Technology" §1.5.1 McGraw Hill, 1983). Therefore, if the silicon single crystal is employed for a substrate, oxygen of a proper and uniform concentration is necessary. For this purpose, the oxygen concentration in the molten liquid of raw materials in the crucible should be kept constant.

The oxygen which is supplied into the molten liquid from the surface of the quartz crucible through contact therebetween is stirred by a forced convection of the molten liquid due to the rotation of the crucible and a heat convection of the molten liquid due to the temperature difference thereof in the crucible. During stirring, the oxygen is not only evaporated from the surface of the liquid in the form of silicon monoxide (SiO), but is carried to the growth surface of the silicon single crystal and taken thereinto. Therefore, when the amount of molten liquid is large in the crucible with a large contact area with the quartz crucible as in an early stage of the crystal growth, the oxygen concentration in the molten liquid is high. On the other hand, as the silicon single crystal proceeds to grow, the amount of the molten liquid in the crucible is decreased and the contact area between the molten liquid and quartz crucible is reduced, whereby the oxygen concentration in the molten liquid becomes lowered. Consequently, the oxygen concentration in the silicon single crystal is generally high in the initial stage of the growth, whereas it is lowered along with the growth of the crystal. The above oxygen concentration in the silicon single crystal is, however, not determined only by the amount of the molten liquid or the contact area with the crucible, but is related also to the dissolved amount of quartz, flow of the molten liquid carrying the dissolved oxygen, evaporation rate of silicon monoxide (SiO), etc. Moreover, the dissolved amount of quartz referred to above is influenced by the temperature of walls of the crucible (H. Hirata and K. Hoshikawa, Jpn.J.Appl.Phys. Vol. 19 No. 8 p. 1573–4 (1980)), namely, the heating distribution of the heater to the crucible. Further, it is also known that the convection of the molten liquid is influenced by the rotation rate of the crucible. Further, it is also known that the rate of SiO is influenced by the flow speed of the ambient atmosphere, i.e., Ar gas. These factors are mutually combined each other to determine the oxygen concentration in the silicon single crystal. Therefore, it is considerably difficult to maintain constant the oxygen concentration from the start to the end of the crystal growth.

As one method to control the oxygen concentration in the molten liquid, namely, oxygen concentration in the silicon single crystal, Japanese Patent Laid-open Publication Nos. 57-27996 (27996/1982) and 57-135796 (135796/1982) disclose, with noting the relation between the rotation rate of the crucible and the oxygen concentration in the silicon single crystal, changing the rotation rate of the crucible in relation to the amount of the molten liquid, thereby changing the relative speed of the quartz crucible and molten liquid, which results in a forced convection of the molten liquid. Thus, it becomes possible to adjust the thickness of a boundary layer where the oxygen is diffused in the surface of the quartz crucible by the forced convection of the molten liquid. Japanese Patent Laid-open Publication No. 62-153191 (153191/1987) discloses another method, wherein the contact area between the quartz crucible and molten liquid and the temperature of the molten liquid are changed. Specifically, according to this latter method, while the supplying ratio of electric power to a plurality of heaters provided in the periphery of side walls of the crucible is adjusted, and accordingly a part of the raw materials are kept in the solid state in the crucible, the silicon single crystal is grown.

According to the former method, however, disadvantages were noticed by the inventors of this invention in that the width of variation of the oxygen concentration cannot be held within $\pm 0.5 \times 10^{17}$ atom/cm$^3$, or the promotion of the convection of the molten liquid in the crucible develops a large irregularity of a dopant concentration because of the unfixed growing speed. The result of experiments related to the latter method reveals as well that a large shearing stress is undesirably applied to the crucible since the raw materials are repeatedly dissolved and solidified in the crucible, thereby creating a break of the crucible. If these prior art methods are applied to a producing apparatus using a shielding member which has a function to prevent a silicon monoxide deposit from falling into the crucible, a function to prevent a radiant heat from the molten liquid from affecting the pulled-up silicon single crystal and a function to rectify a gas inside the chamber, the high temperature region of the molten liquid is moved upwards in the crucible, thereby reducing the temperature in the lower part of the crucible. As a result, the amount of oxygen dissolved from the bottom of the quartz crucible is reduced, and accordingly the concentration of oxygen taken into the silicon single crystal is reduced. Therefore, a high oxygen concentration cannot be achieved in this producing apparatus through the forced convection of the molten liquid or the like.

In the meantime, a silicon single crystal added with antimony (Sb) as a dopant is also used for a semiconductor substrate. When the Sb doped silicon single crystal is produced by the Czochralski method, since the vapor pressure of diantimony trioxide ($Sb_2O_3$) resulting from the addition of Sb is much higher than that of silicon monoxide (SiO), a large amount of oxygen evaporates from the surface of the molten liquid, causing reduction in the amount of oxygen in the molten liquid. Therefore, as compared with the case when phosphorus, boron or the like is used as a dopant, the oxygen concentration in the produced silicon single crystal becomes considerably lowered. As described earlier, although it may be proposed that the rotation rate of the crucible is raised to accelerate the convection to increase the amount of oxygen dissolved from the crucible, an interference between the crucible and silicon single crystal which is rotated in a reverse direction to the crucible brings about waves in the molten liquid if the rotation rate of the crucible is raised too much. In consequence to this, the distribution of the dopant in a radial direction becomes not uniform and the silicon single crystal is dislocated. Therefore, the rotation rate of the crucible can be raised only to a certain limit. Even when the Sb doped silicon single crystal of about $0.01\Omega$ cm is produced by rotating the crucible at 30 rpm, the oxygen concentration not lower than $13 \times 10^{17}$ atom/cm$^3$ is hardly realized, so that the IG effect can't be expected.

The distribution in a pull-up direction of the dopant taken into the silicon single crystal is determined by the segregation coefficient and initial concentration thereof. The segregation coefficient depends on the convection speed of the molten liquid or rotation rate of the silicon single crystal (J. A. Burton, R. C. Prim and P. Slichter, J. Chem. Phys. 21 p. 1987 (1953)). Since the convection speed depends on the rotation rate of the crucible and single crystal, it is similarly difficult to make uniform the dopant concentration in a radial direction of the silicon single crystal. Accordingly, the specific resistance of the single crystal becomes nonuniform in the radial direction and the yield of the integrated circuit becomes lowered.

In order to solve the above-described problems, such a proposal is made that the molten liquid is positioned in a magnetic field. The convection of the electro-conductive molten liquid is lowered by the applied magnetic field, thereby to stabilize the crystal growth surface, and accordingly the ununiformity in the dopant concentration in the radial direction is improved. However, although the oxygen taken into the silicon single crystal is able to be made uniform in low concentration (not higher than $5 \times 10^{17}$ atom/cm$^3$) through slowing of the convection of the molten liquid in contact with the crucible, a high concentration (not lower than $15 \times 10^{17}$ atom/cm$^3$) of oxygen sufficient to realize the IG effect is hard to be obtained.

SUMMARY OF THE INVENTION

The inventors of this invention have found out that the oxygen concentration in the molten liquid in the crucible is closely related to the temperature of the bottom wall inside the crucible after they have tried various kinds of research and experiments to make the oxygen concentration uniform in the pull-up direction of the single crystal.

Figure 1:
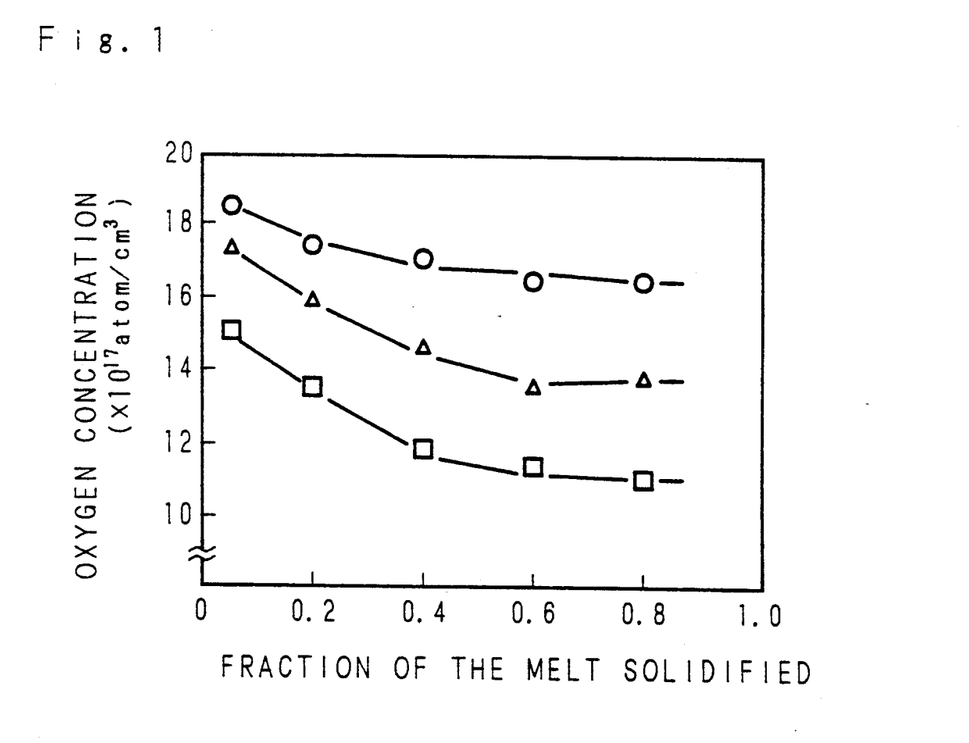
FIG. 1 is a graph showing the relation between the oxygen concentration of a silicon single crystal and the output fraction of a bottom heater.

FIG. 1 is a graph showing the change of the fraction of the melt solidified with the growth progressing and that of the oxygen concentration in the silicon single crystal. For heating the crucible, a side heater is provided in the lateral periphery of the crucible, and a bottom heater is placed below the bottom of the crucible. The relation between the fraction of the melt solidified and oxygen concentration is measured by changing the output fraction of the bottom heater. In the graph, a line plotted by o indicates the case when the output fraction of the bottom heater is 40%, a line plotted by $\Delta$ is the case of 20% and a line plotted by $\square$ is the case of 0. As is clearly understood from the graph, the oxygen concentration in the silicon single crystal is higher as the output fraction of the bottom heater is raised.

Figure 2:
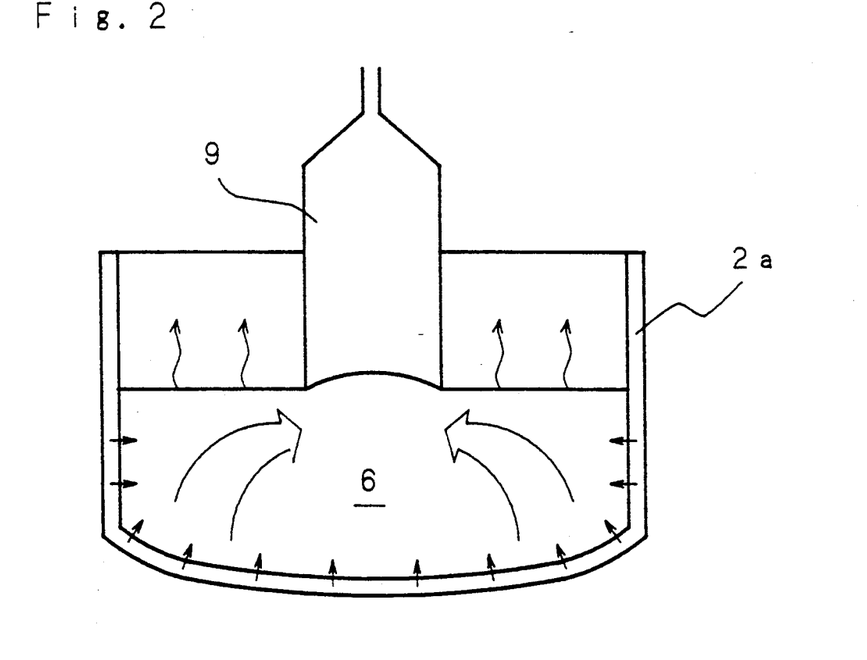
FIG. 2 is a diagram showing the state of the oxygen in a crucible.

The reason for the above fact is not fully understood, but is generally considered as follows. FIG. 2 illustrates the state of the oxygen in an inner crucible $2a$ made of quartz. The oxygen is supplied into a molten liquid 6 from the wall of the inner crucible $2a$ as indicated by arrows. Since the molten liquid 6 flows in a direction indicated by white arrows, the oxygen supplied through the lateral wall of the inner crucible $2a$ is brought to the surface of the molten liquid 6 to evaporate therefrom, while the oxygen supplied from the bottom wall of the inner crucible $2a$ runs to below the growing region of a silicon single crystal 9. Accordingly, the oxygen supplied from the bottom wall is taken into the silicon single crystal 9 with a higher ratio than that supplied from the lateral wall. The higher is the temperature of the wall surface, the more is supplied the oxygen. Therefore, the output of the bottom heater is greatly influential in the supplying amount of oxygen. If the output of the bottom heater is so arranged that the temperature of the bottom wall of the crucible is relatively low in the early stage of the growth, and is gradually raised with the growth processing, the silicon single crystal having the oxygen concentration uniform in the pull-up direction can be produced.

Accordingly, an essential object of this invention is to provide an apparatus and a method for producing a silicon single crystal whereby the oxygen concentration in a pull-up direction of the silicon single crystal can be uniform.

Another object of this invention is to provide an apparatus and a method for producing a silicon single crystal whereby the oxygen concentration of the silicon single crystal is high even when a shielding member is provided, and can be uniform in a pull-up direction.

A further object of this invention is to provide an apparatus and a method for producing a silicon single crystal whereby the oxygen concentration of the silicon single crystal is high even when antimony Sb is added as a dopant, and can be uniform in a pull-up direction.

A still further object of this invention is to provide an apparatus and a method for producing a silicon single crystal whereby the oxygen concentration of the silicon single crystal can be uniform and the dopant concentration thereof in a radial direction can be uniform.

A yet further object of this invention is to provide an apparatus and a method for producing a silicon single crystal whereby a silicon single crystal suitable for use as a substrate of a semiconductor integrated circuit can be produced.

A producing apparatus of a silicon single crystal according to this invention is provided with first heating means (a side heater) in the lateral periphery of a crucible for heating mainly the lateral part of the crucible and second heating means (a bottom heater) placed below the bottom of the crucible for heating mainly the bottom part of the crucible. A shielding member may be added so as to prevent the radiant heat from the molten liquid.

In a producing method of a silicon single crystal according to this invention, a silicon single crystal is pulled up from the crucible by the Czochralski method while outputs of the side heater and bottom heater are individually controlled. Concretely, the output of each heater is controlled in accordance with a preset temperature profile of the bottom wall inside the crucible. As the pull-up of the silicon single crystal proceeds, the temperature profile is raised, so that the output of the side heater is reduced to increase the output of the bottom heater. Because of the output control as above, the oxygen concentration in the pull-up direction of the silicon single crystal can be made uniform.

Further, besides the output control of each heater, the rotation rate of the crucible may be controlled. If a magnetic field is applied to the molten liquid in the crucible, the obtained silicon single crystal has uniform oxygen concentration and uniform dopant concentration in the radial direction.

The above and further objects and features of the invention will more fully be apparent from the following detailed description with accompanying drawings.

DESCRIPTION OF THE PREFERRED EMBODIMENTS

This invention will be discussed hereinbelow in a detailed manner with reference to the accompanying drawings of preferred embodiments thereof.

Figure 3:
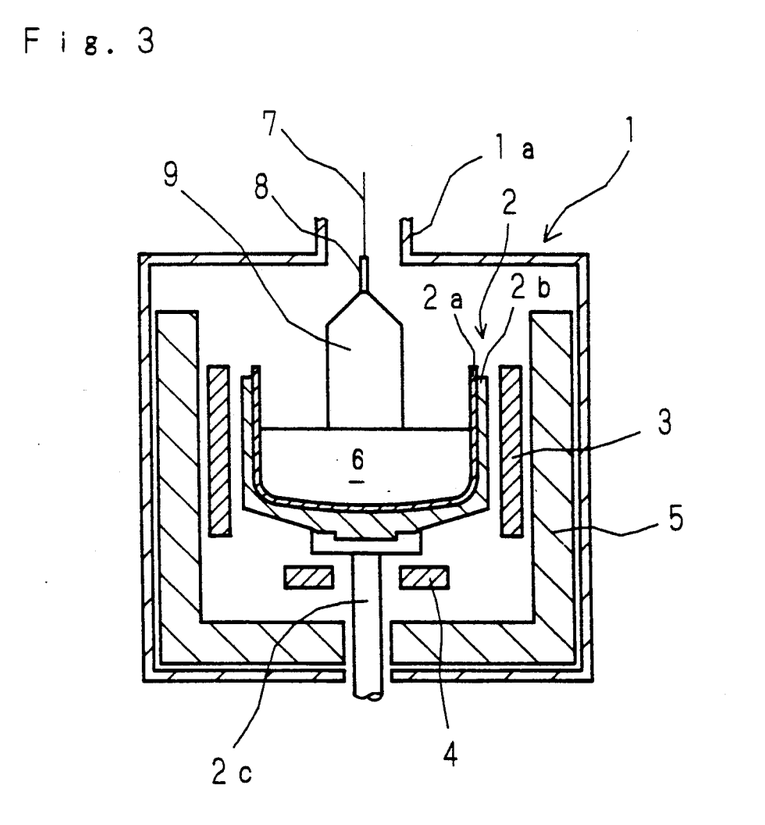
FIG. 3 is a diagrammatic longitudinal cross section of a producing apparatus of a silicon single crystal according to a first embodiment of this invention.
Figure 4:
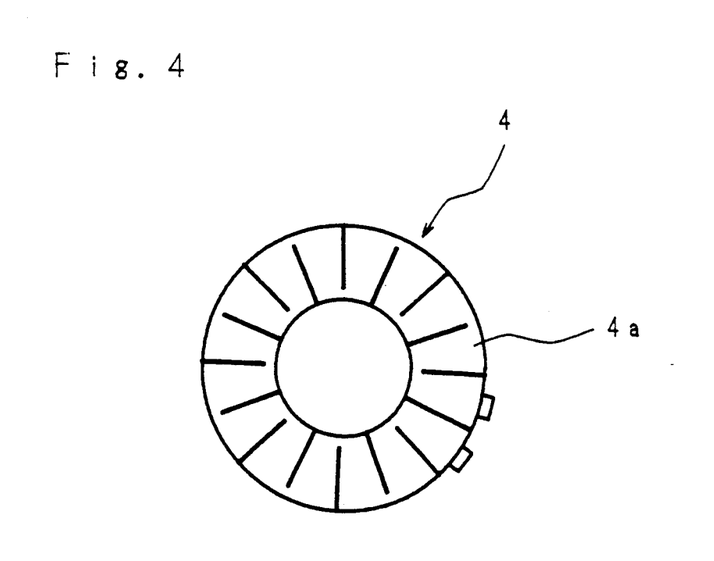
FIG. 4 is a diagrammatic plan view of the bottom heater.

FIG. 3 diagrammatically shows a longitudinal cross section of a producing apparatus of a silicon single crystal according to a first embodiment of this invention. The producing apparatus has a crucible 2 placed at the center inside a chamber 1. First heating means, namely, a cylindrical side heater 3 is provided between the crucible 2 and a heat reserving member 5 in a manner to surround the lateral wall of the crucible 2. Moreover, second heating means, i.e., a circular bottom heater 4 is spaced 10-100 mm from the bottom of the crucible 2. The bottom heater 4 is movable up and down around a shaft 2c. A plan view of the bottom heater 4 is diagrammatically shown in FIG. 4, wherein a heater wire 4a is arranged zigzag between inner and outer peripheries of the heater. Outputs of the side heater 3 and bottom heater 4 are controllable independently of each other.

The crucible 2 is formed in a double structure with an inner crucible 2a made of quartz and an outer crucible 2b made of graphite. The shaft 2c passing through the bottom wall of the chamber 1 is coupled at an upper end thereof to the center of the bottom of the crucible 2, so that the crucible 2 is moved up and down while being rotated by the shaft 2c. A raw material for a single crystal, for example, polycrystalline silicon is fed into the crucible 2, where it is heated and melted by the side heater 3 and bottom heater 4.

A guard cylinder 1a for guarding a single crystal which serves also as a supply pipe of an ambient atmosphere gas into the chamber 1 is erected at the center of the upper wall of the chamber 1. A rotation and up-and-down mechanism (not shown) is provided above the guard cylinder 1a, to which is coupled an upper end of a lift axis 7. A seed crystal 8 seized by a chuck is hung down from a lower end of the lift axis 7. The seed crystal 8 is, after being dipped into a molten liquid 6 within the crucible 2, raised upwards while being rotated, so that the silicon single crystal 9 is grown at the lower end of the seed crystal 8.

The polycrystalline silicon is put into the crucible 2, heated and melted by the side and bottom heaters 3 and 4, and the seed crystal 8 is dipped into the molten liquid 6. Then, while the seed crystal 8 is being rotated, it is raised to facilitate the growth of the silicon single crystal 9. Simultaneously with the start of growth of the silicon single crystal 9, the outputs of the side and bottom heaters 3 and 4 and the rotation rate of the crucible 2 alike are started to be controlled. This control is continued until the silicon single crystal 9 is completely pulled up.

Figure 5:
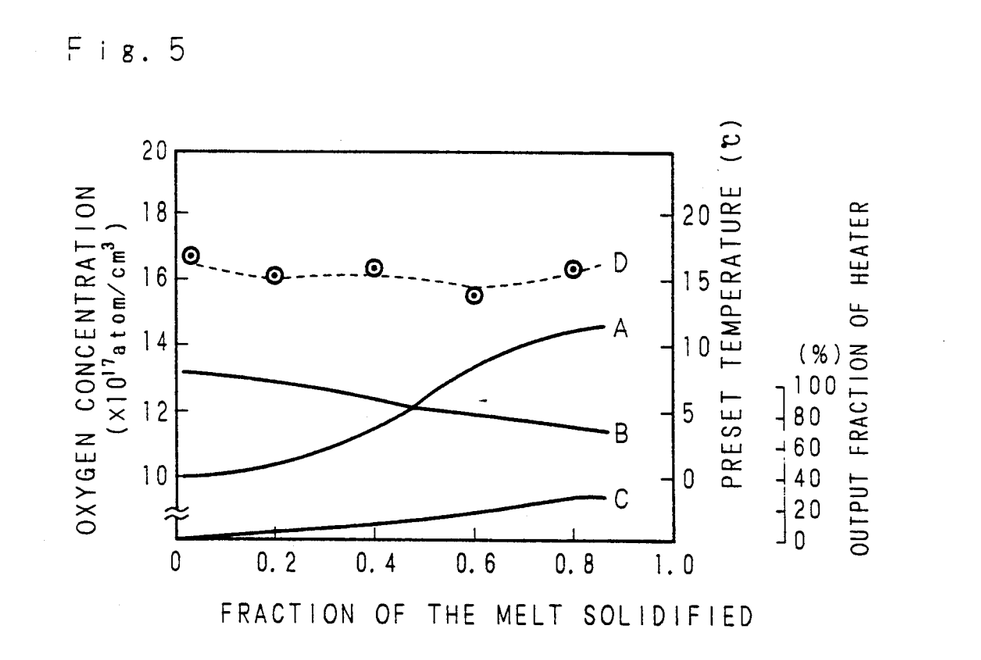
FIGS. 5 and 6 are graphs showing the controlling content and result thereof in a producing method of a silicon single crystal according to one embodiment of this invention.

FIG. 5 shows the relation of a preset temperature profile of the bottom wall inside the crucible 2, controlling pattern of each of the side and bottom heaters 3 and 4 and oxygen concentration in the pull-up direction of the silicon single crystal 9. In the graph, an abscissa indicates the fraction of the melt solidified of the silicon single crystal 9, and an ordinate indicates the preset temperature (°C.), output fraction of a heater (%) and oxygen concentration ($\times 10^{17}$ atom/cm$^3$). It is to be noted here that the preset temperature means a temperature difference from the melting point (1412° C.) of silicon. Moreover, a line A indicates the preset temperature profile of the bottom wall inside the crucible 2 (bottom wall inside the inner crucible 2a), with lines B, C and D representing an output fraction of the side heater 3, an output fraction of the bottom heater 4 and the oxygen concentration in the pull-up direction of the obtained silicon single crystal 9, respectively.

After the profile (line A in the graph) is preliminarily set from experiments so that the oxygen concentration of the silicon single crystal becomes constant, the temperature of the bottom wall inside the crucible 2 is arranged during the crystal growth to follow the preset profile through output control of the heaters 3 and 4. More specifically, the output fraction of the side heater 3 is gradually reduced as the pull-up of the crystal is proceeded (the fraction of the melt solidified is increased), whereas the output fraction of the bottom heater 4 is gradually increased. With the use of the apparatus shown in FIG. 3, when the oxygen concentration of the silicon single crystal is set to be $16 \times 10^{17}$ atom/cm$^3$, and each output fraction of the heaters 3 and 4 is controlled in accordance with the pattern shown in FIG. 5 while the crucible 2 is rotated at a constant speed, it is recognized as is indicated by the line D in FIG. 5 that the oxygen concentration in the pull-up direction of the silicon single crystal can be held in the range $15.5 \times 10^{17} \sim 16.4 \times 10^{17}$ atom/cm$^3$.

Figure 6:
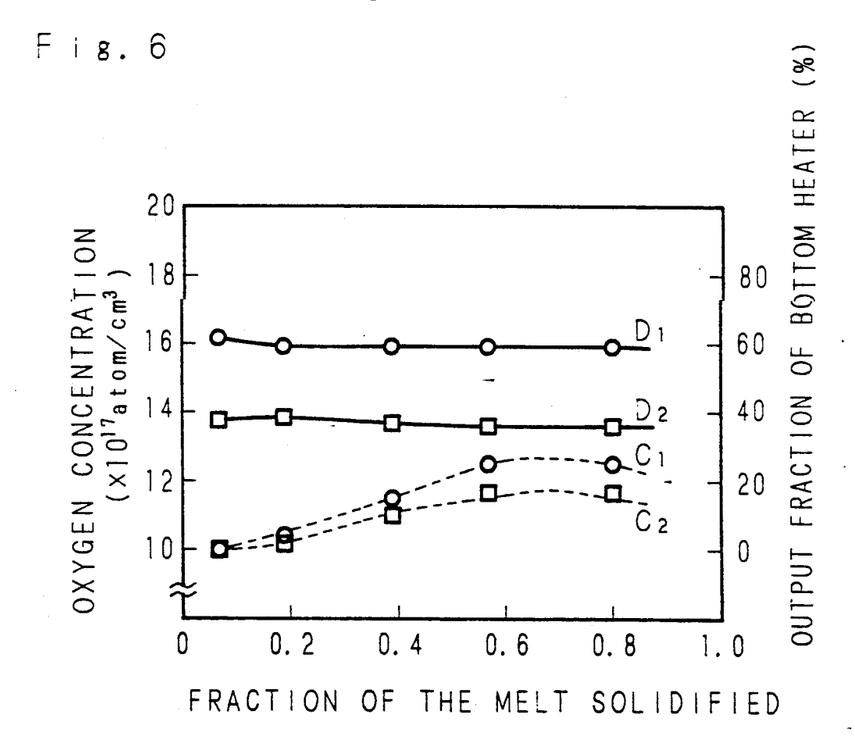

Meanwhile, when the oxygen concentration of the silicon single crystal is set to be $16 \times 10^{17}$ atom/cm$^3$ and $14 \times 10^{17}$ atom/cm$^3$, respectively, in first and second samples of using the apparatus of FIG. 3 to produce the silicon single crystal 9, the controlling pattern of outputs of the bottom heater at this time and the result of the control are shown in a graph of FIG. 6. The abscissa represents the fraction of the melt solidified of the silicon single crystal 9, and the ordinate represents the oxygen concentration ($\times 10^{17}$ atom/cm$^3$) and output fraction (%) of the bottom heater 4. Lines $C_1$ and $D_1$ represent the first example, and lines $C_2$ and $D_2$ show the second example. According to the first example, the rotation rate of the crucible 2 is rendered constant 8 rpm, whereas it is controlled to be increased in the range $10 \sim 15$ rpm along with the progression of the growth of the silicon single crystal according to the second example. As a result, the oxygen concentration in the first example is $15.8 \times 10^{17} \sim 16.5 \times 10^{17}$ atom/cm$^3$, and $13.5 \times 10^{17} \sim 14.1 \times 10^{17}$ atom/cm$^3$ in the second example. Accordingly, a uniformity in the oxygen concentration that would never be realized by the prior art can be achieved.

The following description is related to a case when an Sb doped silicon single crystal is produced. The producing apparatus shown in FIG. 3 is employed. Raw materials are first put in the crucible 2 and heated by the side heater 3 and bottom heater 4. After the raw materials are melted, Sb is doped into the molten liquid 6. Then, the seed crystal 8 is dipped into the molten liquid 6. Thereafter, the seed crystal 8 is pulled up while being rotated, thereby allowing the silicon single crystal 9 to start growing. The output control of the heaters 3 and 4 is started concurrently with the start of growth of the silicon single crystal 9. The output control is continued until the silicon single crystal 9 is completely pulled up.

Figure 7:
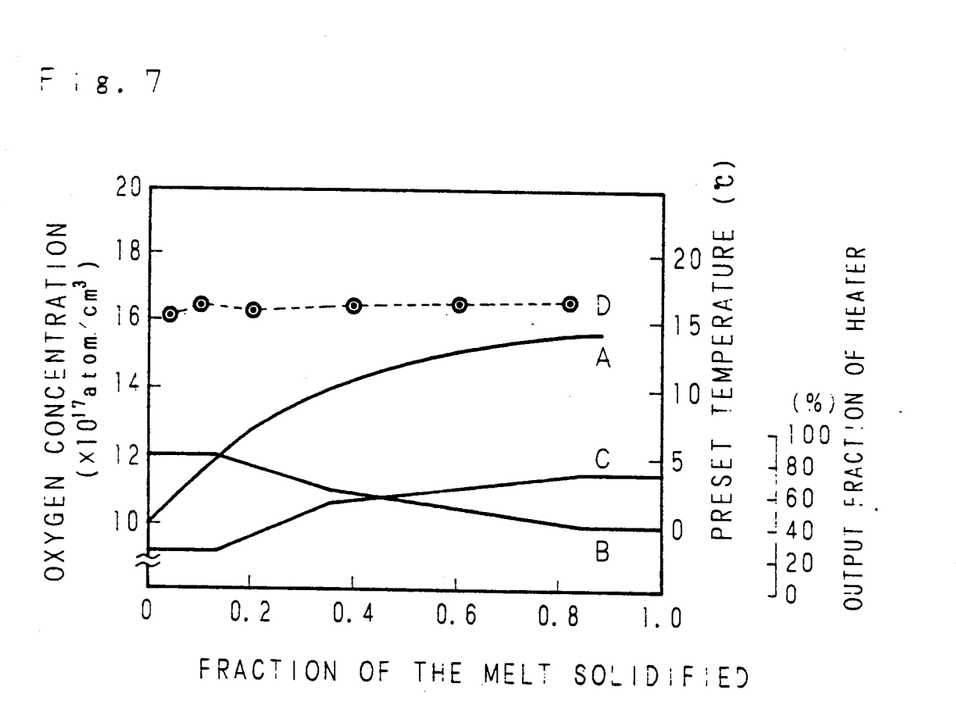
FIG. 7 is a graph showing the controlling content and result thereof in a producing method of a silicon single crystal according to another embodiment of this invention.

FIG. 7 is a graph showing the relation of the preset temperature profile of the bottom wall inside the crucible 2, each controlling pattern of the side heater 3 and bottom heater 4, and oxygen concentration in the pull-up direction of the silicon single crystal 9. The abscissa and ordinate of FIG. 7 represent the same as in FIG. 5, and moreover lines A, B, C and D represent the same as in FIG. 5. After the profile (line A in FIG. 7) is preliminarily set from experiments so that the oxygen concentration of the silicon single crystal is constant, outputs of the side heater 3 and bottom heater 4 are controlled during the crystal growth so as to make the temperature of the bottom wall inside the crucible 2 follow the preset profile. Specifically, the output fraction of the side heater 3 is gradually lowered along with the progression of the pull-up of the crystal (increase of the fraction of the melt solidified), with that of the bottom heater 4 being gradually increased. Since the oxygen concentration is lowered as a whole when Sb is added, the output fraction of the bottom heater 4 should be increased as compared with that in the controlling pattern of FIG. 5.

When the oxygen concentration of the silicon single crystal 9 is set to be $16 \times 10^{17}$ atom/cm$^3$, the crucible 2 is rotated at a constant speed and the outputs of the side heater 3 and bottom heater 4 are controlled in accordance with the controlling pattern shown in FIG. 7 with employing the apparatus of FIG. 3, an Sb doped silicon single crystal having the specific resistance of 0.01 Ωcm and the oxygen concentration in the pull-up direction maintained within the range $16.3 \times 10^{17} \sim 16.9 \times 10^{17}$ atom/cm$^3$ can be produced.

A further embodiment of this invention will be described hereinbelow.

Figure 8:
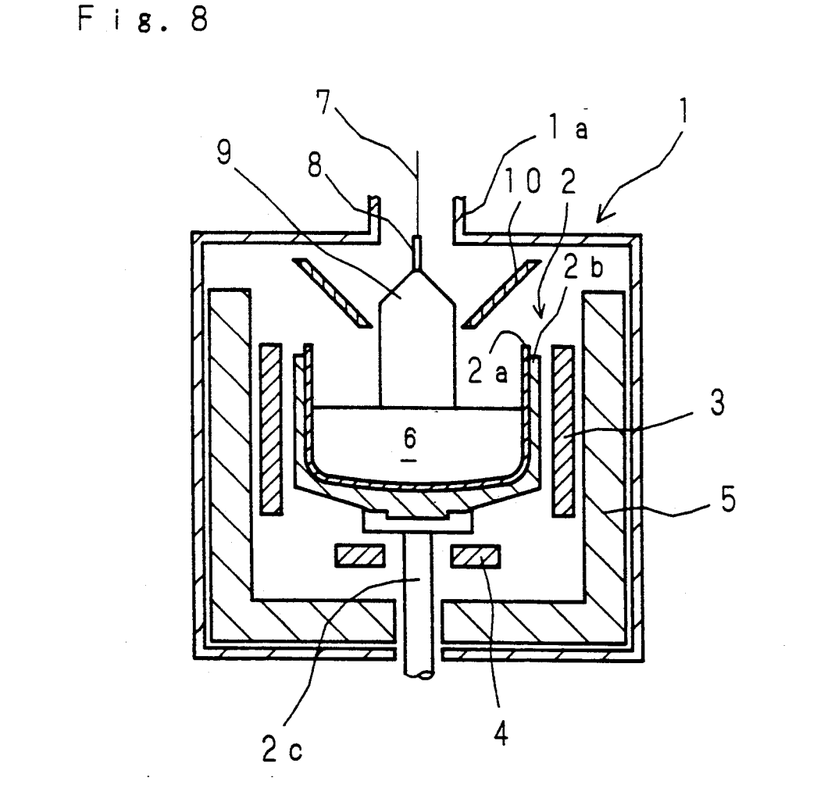
FIG. 8 is a diagrammatic longitudinal cross section of a producing apparatus of a silicon single crystal according to a second embodiment of this invention.

FIG. 8 is a diagrammatic longitudinal cross section of a producing apparatus of a silicon single crystal according to a second embodiment of this invention. In FIG. 8, like parts are designated by the same reference numerals as in FIG. 3 and therefore detailed thereof will be abbreviated here. In the producing apparatus of the second embodiment, a shielding member 10 which is a truncated cone turned upside down is placed above the crucible 2. A support frame of the shielding member 10 is omitted in the drawing. The shielding member 10 is intended to prevent the coagulating silicon monoxide deposit from falling into the crucible 2. Moreover, the shielding member 10 is effective to shut off the radiant heat from the crucible 2, molten liquid 6, side heater 3 and bottom heater 4. Accordingly, the radiant heat cannot reach the silicon single crystal 9. Furthermore, the shielding member 10 introduces a carrier gas such as Ar entering the chamber 1 from thereabove to the center of the crucible 2, allowing the gas to flow from the center of the crucible 2 along the surface of the molten liquid 6 to the peripheral part thereof. On the other hand, an evaporating gas from the molten liquid 6 is led outwards by the shielding member 10 from the periphery of the crucible 2 to a discharge port (not shown) formed in the lower part of the chamber 1. Even when the shielding member 10 mentioned above is provided, if each output control of the side heater and bottom heater 3 and 4 is done in the similar manner as in the foregoing embodiment, the silicon single crystal having the uniform oxygen concentration of a desired value in the pull-up direction can be produced.

A still further embodiment of this invention will be discussed now.

Figure 9:
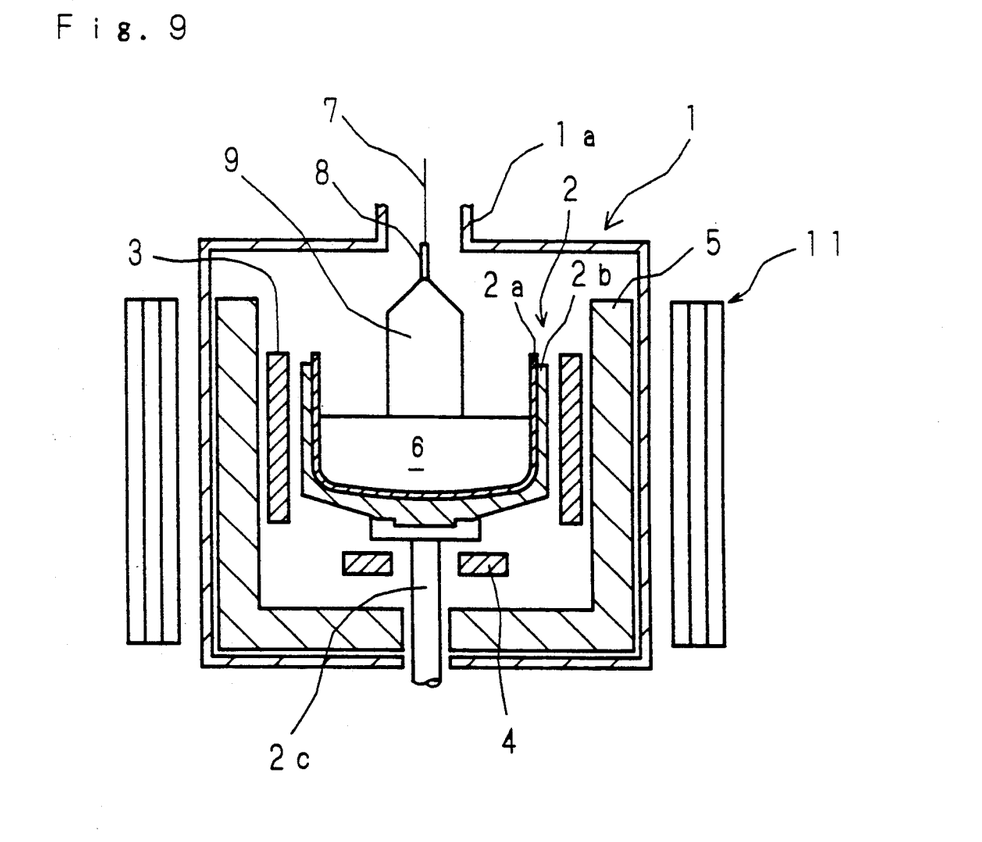
FIG. 9 is a diagrammatic longitudinal cross section of a producing apparatus of a silicon single crystal according to a third embodiment of this invention.

FIG. 9 shows a diagrammatic longitudinal cross section of a producing apparatus of a silicon single crystal according to a third embodiment of this invention, wherein the same parts are designated by the same reference numerals as in FIG. 3, the description of which will therefore be abbreviated. In the producing apparatus according to the third embodiment, a magnet 11 is provided around the chamber 1. The magnet 11 is approximately at the same height as an upper part of the crucible 2 from the bottom of the chamber 1. The magnet 11 may be a permanent magnet or an electromagnet. If an electromagnet is used, it can generate AC/DC strong/weak magnetic field, driven by electric current.

Raw materials put in the crucible 2 are heated and melted by the side heater 3 and bottom heater 4. Then, a predetermined magnetic field is applied by the magnet 11 to the molten liquid 6, when the seed crystal 8 is dipped into the molten liquid 6. While the seed crystal 8 is being rotated, it is pulled up, allowing the silicon single crystal 9 to start growing. At the same time when the silicon single crystal 9 starts growing, each output control of the side heater 3 and bottom heater 4 is started to continue until the silicon single crystal 9 is completely pulled up. The intensity of the magnetic field applied to the molten liquid 6 is preliminarily selected from experiments properly for every producing condition of the silicon single crystal so that the oxygen concentration sufficient to achieve the IG effect is obtained, and moreover, the dopant concentration in a radial direction of the silicon single crystal becomes uniform. Therefore, if the producing condition is changed, the intensity of the magnetic field may be changed on the basis of a reference value, that is, the preliminarily-selected intensity.

Figure 10:
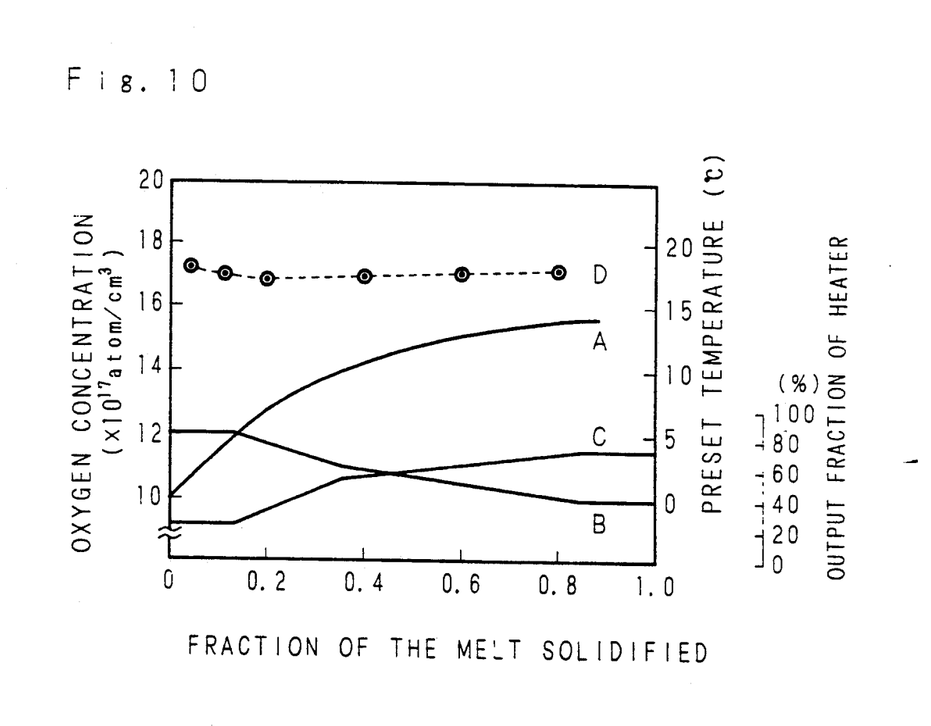
FIG. 10 is a graph showing the controlling content and result thereof in a producing method of a silicon single crystal according to a further embodiment of this invention.

FIG. 10 shows a graph of the relation among the set temperature profile of the bottom wall inside the crucible 2, each controlling pattern of the side heater 3 and bottom heater 4 and oxygen concentration in the pull-up direction of the silicon single crystal 9. The abscissa and ordinate in this FIG. 10 represent the same as in FIG. 5, and the lines A, B, C and D show the same as in FIG. 5.

The profile (line A in FIG. 10) is preliminarily set from experiments so that the oxygen concentration of the silicon single crystal is constant, and the temperature of the bottom wall inside the crucible 2 is adjusted during the crystal growth to follow the preset profile through output control of the heaters 3 and 4. Specifically, with the progression of the pull-up of the crystal (increase of the fraction of the melt solidified), the output fraction of the side heater 3 is gradually lowered, while the output fraction of the bottom heater 4 is gradually increased. Since the application of the magnetic field slows the convection of the molten liquid 6, the crystal growth surface is stabilized. Accordingly, the dopant concentration in the radial direction of the silicon single crystal 9 can be made uniform. On the other hand, the lowering of the oxygen concentration due to the application of the magnetic field can be compensated by the output control of the bottom heater 4, which is a significant element to affect the lowering. Since the dissolving amount of quartz is increased when the temperature of the bottom wall inside the crucible 2 is raised, the diffusion of the oxygen due to the difference in concentration thereof is not lowered even when the convection of the molten liquid 6 is restrained. As a result of this, the oxygen concentration in the growth surface of the crystal can be increased, thereby preventing the lowering of the oxygen concentration of the silicon single crystal 9.

Meanwhile, with using the apparatus shown in FIG. 9, the oxygen concentration of the silicon single crystal 9 is set to be $16 \times 10^{17}$ atom/cm$^3$, and the crucible 2 is rotated at constant 5 rpm and the seed crystal 8 is rotated at 20 rpm. A magnetic field of 3500 Gauss is applied to the molten liquid 6 in the crucible 2 by the magnet 11. Each output of the heaters 3 and 4 is controlled in accordance with the controlling pattern shown in FIG. 10. In this case, as indicated by the line D in FIG. 10, the variation of the oxygen concentration in the pull-up direction of the silicon single crystal 9 is held within ±3%. It is to be noted here that the variation of the oxygen concentration in the radial direction is within 5%.

Figure 11A:
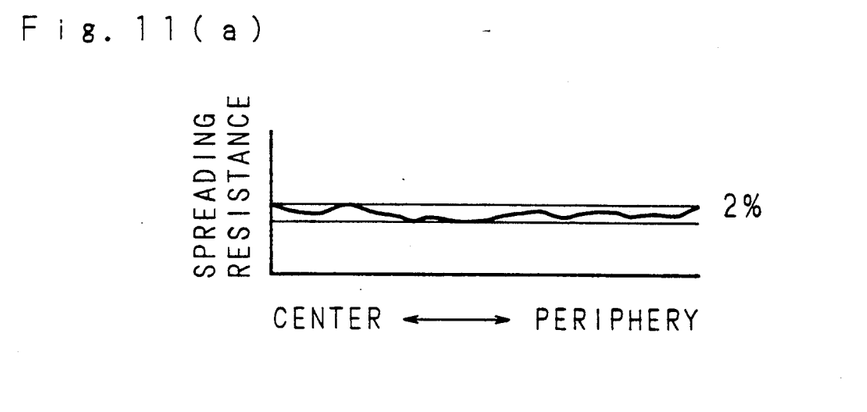
FIGS. 11(a) and 11(b) are graphs showing a dopant concentration in a radial direction of a silicon single crystal.
Figure 11B:
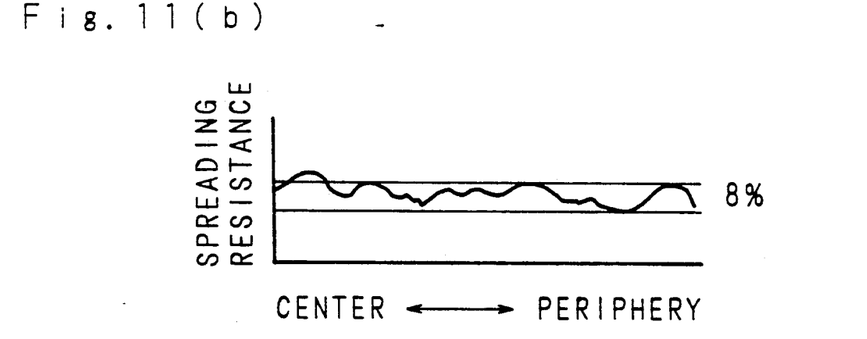

The spreading resistance in the radial direction of the silicon single crystal produced in the above-described manner is measured. The spreading resistance of the silicon wafer in the area from the center to 5 mm inward of the outer periphery is measured. The result is shown in FIG. 11; FIG. 11(a) being the case when the magnetic field is applied and FIG. 11(b) being the case when the magnetic field is not applied. As is apparent from the graph, without the magnetic field applied, the spreading resistance is widely varied (8%). On the contrary, when the magnetic field is applied, the spreading resistance is varied little (2%). Accordingly, if the magnetic field is applied to the molten liquid 6, the silicon single crystal having the uniform dopant concentration in the radial direction can be obtained.

In any of the foregoing embodiments, the side heater 3 and bottom heater 4 are respectively singly provided in the lateral periphery and below the bottom of the crucible 2. However, each heater may be provided in a plural number and in such case, the output control should be done for each.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. An apparatus for producing a silicon single crystal by Czochralski method wherein said silicon single crystal is pulled up from a crucible, comprising:

first heating means provided in the periphery of said crucible for heating mainly the lateral part of said crucible;

second heating means provided below the bottom of said crucible for heating mainly the bottom of said crucible; and control means electrically connected to the first and second heating means for controlling heat output of said first and second heating means independently of each other.

2. An apparatus for producing a silicon single crystal as claimed in claim 1, further comprising a shielding member for shielding said silicon single crystal from a molten liquid in said crucible except in the pull-up region thereof.

3. An apparatus for producing a silicon single crystal as claimed in claim 1, further comprising a magnet for applying a magnetic field to a molten liquid in said crucible.

4. An apparatus for producing a silicon single crystal as claimed in claim 3, wherein said magnet is an electromagnet.

5. An apparatus for producing a silicon single crystal as claimed in claim 1, wherein said first and second heating means are heated electrically.

6. An apparatus for producing a silicon single crystal as claimed in claim 1, wherein an inside face of said crucible comprises quartz.

7. An apparatus for producing a silicon single crystal as claimed in claim 1, wherein said crucible is rotatable about an axis of rotation and the apparatus further comprises means for controlling a rate of rotation of said crucible.

8. An apparatus for producing a silicon single crystal as claimed in claim 1, wherein said control means reduces said heat output of said first heating means and increases said heat output of said second heating means when said apparatus is used for producing a silicon single crystal.

* * * * *